United States Patent [19]

Early

[11] 4,335,457
[45] Jun. 15, 1982

[54] METHOD FOR SEMICONDUCTOR MEMORY TESTING

[75] Inventor: James M. Early, Palo Alto, Calif.

[73] Assignee: Fairchild Camera & Instrument Corp., Mountain View, Calif.

[21] Appl. No.: 176,353

[22] Filed: Aug. 8, 1980

[51] Int. Cl.³ .................. G01R 31/28; G11C 29/00
[52] U.S. Cl. ............................... 371/28; 324/73 R; 364/900; 371/20; 371/21
[58] Field of Search .................. 371/28, 20, 21, 25; 324/73 R, 73 AT; 364/200, 900

[56] References Cited

U.S. PATENT DOCUMENTS

| | | | |
|---|---|---|---|
| 3,252,097 | 5/1966 | Homan | 371/28 |
| 3,478,286 | 11/1969 | Dervan | 371/21 |
| 3,619,030 | 11/1971 | Creasy | 364/200 |
| 3,820,077 | 6/1974 | Giebler et al. | 364/200 |
| 4,061,908 | 12/1977 | de Jonge et al. | 371/21 |
| 4,102,491 | 7/1978 | DeVito et al. | 371/28 |
| 4,108,358 | 8/1978 | Niemaszyk et al. | 324/73 AT |

OTHER PUBLICATIONS

Geffken, Variable Parameter Tester Control System, IBM Technical Disclosure Bulletin, vol. 20, No. 7, Dec. 1977, pp. 2596-2598.
Manual Entitled "LSI/VLSI Test System—Sentry VIII", Fairchild Camera & Instrument Corp., 1978, 1979, U.S.A.
Manual Entitled "Mastr Factor", a Programming Language Reference Manual", Fairchild Camera & Instrument Corp., 1979, Feb. 1979 Edition.

Primary Examiner—Charles E. Atkinson
Attorney, Agent, or Firm—Paul J. Winters; Michael J. Pollock; Warren M. Becker

[57] ABSTRACT

Semiconductor memory devices are tested by using a special purpose computer which uses simple test patterns to determine the weakest bits of the device and then tests only these relatively few "weak bits" and structurally and operationally adjacent bits using highly complex test patterns to determine if the device is functioning properly. This procedure considerably reduces testing time over that required using prior art techniques.

7 Claims, 7 Drawing Figures

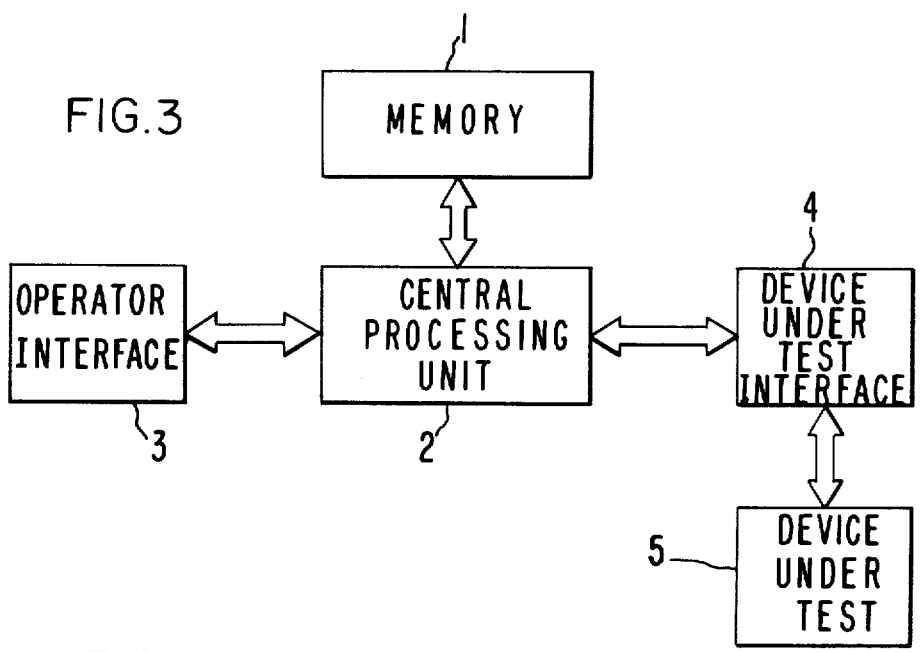
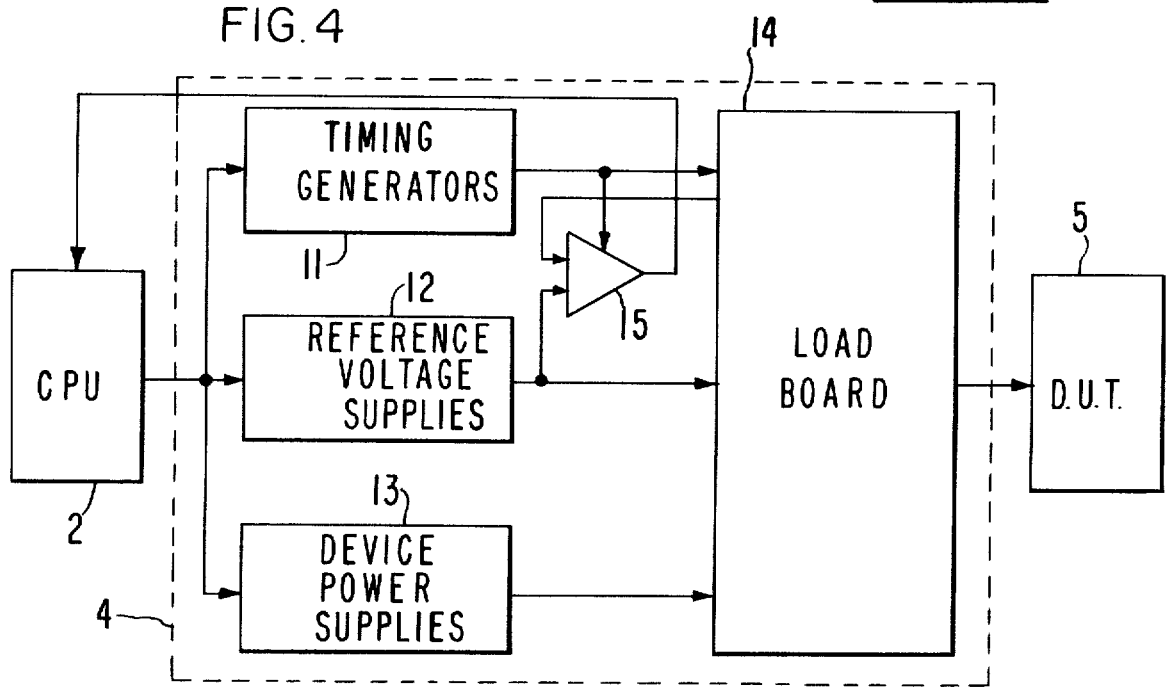

METHOD FOR SEMICONDUCTOR MEMORY TESTING

BACKGROUND OF THE INVENTION

1. Field of the Invention

This invention relates to the testing of semiconductor memory devices utilizing special purpose computer programs.

2. Description of the Prior Art

The use of special purpose computers in the testing of semiconductor memory devices is well known in the prior art. Certain prior art techniques require that each bit of the memory be tested with the most complex test patterns representative of the most complex conditions to be encountered in operation, as well as the simplest, in order to insure that the memory device will function properly in a system. Typically, several tests are performed where, in a predetermined pattern of ones and zeroes, a single bit is altered, and then all bits in the memory are reverified. Such tests are performed until each bit is changed several times, with the entire memory array being reverified after each change. Thus, there must be a minimum of $N^2T$ bit verifications performed, where N is the number of bits in the memory, and T is the number of times each bit is changed.

Thus, testing time increases as the square of the number of bits in the memory. For very large memories, this testing time may become several hours per device, which would be prohibitively expensive.

SUMMARY OF THE INVENTION

This invention overcomes the necessity of a large number of bit verifications, as required in prior art methods of testing semiconductor memory devices. This is accomplished by first testing a device with simple test patterns, while altering operating conditions in successive increments beyond the operating limits specified for proper operation of the device. As operating conditions are changed, the weakest bits in the memory device will fail first. The location of these weakest bits are stored in the computer memory. Then, utilizing a set of complex test patterns, only these few weakest bits are then tested with operating conditions set as specified for normal operating conditions. Disposition of the device being tested is then made based on the test results of this last set of complex test patterns. Testing time is thereby significantly reduced over the test time required by prior art methods, with a substantial cost savings.

BRIEF DESCRIPTION OF THE DRAWINGS

FIGS. 2a–2d depict several types of data patterns used in testing semiconductor memory devices.

FIG. 3 is a simplified block diagram of a special purpose test computer which may utilize the present invention.

FIG. 4 is a block diagram showing the relationship between the central processing unit, the device under test, and the interface therebetween.

DESCRIPTION OF THE PREFERRED EMBODIMENT

Figure 1:
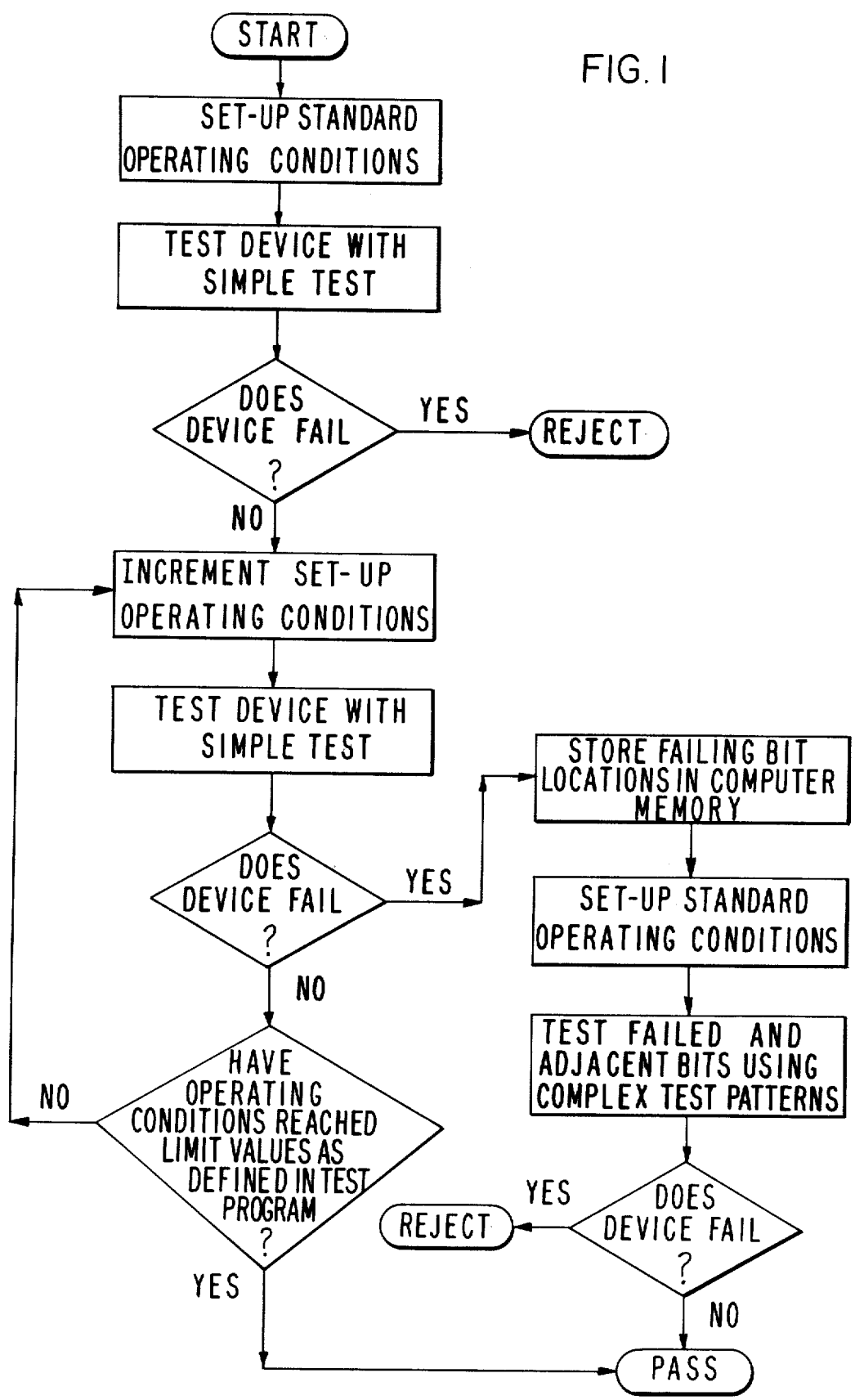
FIG. 1 is a flowchart of the algorithm of this invention.

This invention utilizes a unique special purpose computer algorithm to test semiconductor memory devices, which contain a plurality of memory cells, each cell being capable of storing a single bit. The algorithm of this invention allows the number of tests required to be dramatically reduced over the number of tests required by prior art techniques. As shown in the flowchart of FIG. 1, the algorithm first tests the device using simple memory tests, such as writing a simple data pattern into the device and verifying each bit once, together with simple voltage and speed tests. Simple data patterns are used to determine if all bits in the device are capable of functioning under the most lenient of operating conditions. Such simple memory data patterns include writing logical ones into all bits and writing logical zeros into all bits as shown in FIGS. 2a and 2b.

FIGS. 2c and 2d show simple memory data patterns known as checkerboard and inverse checkerboard, respectively. Simple tests utilizing these patterns write a pattern of alternating ones and zeros into the memory device, and then verify each bit once to insure a checkerboard pattern is actually stored in the device. Because simple tests verify each bit in the memory only once, they are quite fast. Devices which pass these simple tests are then further tested using the same simple patterns, with various operating conditions applied to the device under test (e.g. power supply voltages, input clock pulses, frequency of operation, etc.) altered in successive increments, beyond the limits specified for proper operation, until one or a few bits in the memory fails. These failing bits are the weakest bits of the device, i.e. those most prone to fail, even when all operating conditions applied to the device are within the range specified for proper operation.

These few weakest bits and those structurally or operationally closely related (i.e. those bits with address locations numerically closely related) are those most likely to fail testing with complex test patterns or in actual use in a system. Other weak bits may be known to exist for a particular device type, due to design or fabrication limitations, and may be included in the set of weak bits. Only these few weak bits are then tested with complex patterns at normal device specification limits to determine if these bits function properly under normal operating conditions. If these weakest bits function properly under these normal operating conditions, the entire memory will similarly function properly.

This procedure of determining weak bits may be repeated while altering different test conditions (power supply voltages, input clock pulses, frequency of operation, etc.) to determine several sets of weak bits, which can then all be tested under normal test conditions using complex test patterns. Complex test patterns include those which write a predetermined pattern into the memory vary only a single bit, and then reverify each bit of the memory. By testing all bits using simple test patterns, and then testing with complex test patterns only those relatively few bits determined to be the weakest bits, the number of actual tests performed on a memory device may be dramatically reduced over the number of tests required by prior art techniques with a resultant reduction in actual test time and cost.

The practice of this invention allows reduction of actual bit verifications from $N^2T$ to only NT, or some small multiple thereof. Such large decreases in the number of tests required will result in similarly large decreases in the time and cost required to test semiconductor memory devices.

There are numerous special purpose computers available in the market that are specifically designed for semiconductor testing. The invention may be practiced with any such computer that is capable of applying a wide range of input conditions to the device under test, determining the address locations of failing bits of the memory device under test, and storing these failing bit locations in the test computer memory for later use when testing with highly complex test patterns. Such special purpose computers presently available include the Xincom ® and the Sentry ® series, manufactured by Fairchild Camera and Instrument Corporation of 464 Ellis Street, Mountain View, Calif. 94042.

A computer test system capable of utilizing this invention preferably comprises a central processing unit (CPU), memory, interface between the operator and the CPU, reference voltage supplies, device power supplies, timing generators, and means to strobe the timing generators used to test the output states of the semiconductor device under test.

A block diagram of a basic test system which may be utilized in the practice of this invention is shown in FIG. 3. Computer memory 1 is used to store the test program which contains the set of instructions used to test the semiconductor devices, as well as the locations of the weak bits as determined by using the algorithm of this invention. Central processing unit (CPU) 2 uses the set of instructions contained in the memory to precisely control all components of the computer test system. Operator interface 3 allows human control over the test system. Such operator interfaces typically consist of video keyboard terminals (VKT), line printers for hard copy data output, and means to start and interrupt the testing of individual devices.

Device under test interface 4 is often referred to as pin electronics. The pin electronics (of a well known design) contains means to apply the electronic signals necessary for testing device under test (DUT) 5. A more detailed block diagram of interface 4 is shown in FIG. 4, where CPU 2 and DUT 5 are shown again with their relationship to DUT interface 4. Interface 4 includes timing generators 11, which provide synchronization and timing signals necessary for the operation and testing of DUT 5. Timing generators 11 also provide means to strobe the output pins of DUT 5 which allows their logical states at a specific time to be determined. By applying a known set of address and data inputs to DUT 5, and strobing the data outputs of DUT 5 after a specified time delay, functionality of the device may be determined.

Reference voltage supplies 12 provide reference voltages which correspond to logical 0 and logical 1. These reference voltages are applied to the input pins of DUT 5 as required by the test program, and used as comparisons to determine if the outputs of DUT 5 are at a level corresponding to a 0 or a 1. Device power supplies 13 provide operating power to DUT 5 at a specified voltage.

Comparator 15 is used to compare reference voltages from reference voltage supplies 12 with outputs of DUT 5 at times specified by strobe signals from timing generators 11. Output from comparator 15 is fed back to CPU 2, which then compares the logical states actually present on the outputs of DUT 5 with the correct states as stored in memory 1. If the logic states actually present precisely match the correct states stored in memory 1, device under test 5 has functioned properly. If, on the other hand, there is a discrepancy between the measured states and the stored, correct states, device under test 5 has functioned improperly.

Load board 14 is a means to allow proper connection of each timing generator 11, reference voltage supply 12, device power supply 13 and comparator 15 to the correct pin or pins of DUT 5. It may comprise a printed circuit board containing a socket for insertion of DUT 5, hard wire connections and utility relays which allow connections and disconnections to be made at various points during the test sequence, as defined in the test program.

During operation of a special purpose test computer in accordance with this invention, operator interface 3 of FIG. 3 is used to initiate the test sequence (See FIG. 1). CPU 2 reads the test program stored in memory 1, and controls DUT interface 4 in such a manner as to have a defined set of test conditions applied to DUT 5. This first set of test conditions may include setting the device power supply voltages 13 to a level within the range specified for proper operation of device under test 5, and setting the period of timing generators 11 such that the frequency of operation is not greater than that specified for proper operation of DUT 5. This first set of test conditions may also include setting the delay of timing generators 11 used to strobe the outputs of DUT 5 to such a value as to allow a time delay between a change in input conditions and the determination of output states sufficient for proper operation of the device. Reference voltage levels are also set to their desired levels.

The test program contained in memory 1 then instructs CPU 2 to apply various input states to DUT 5. The input states at this point in the program correspond to relatively simple test patterns, such as writing all zeros into DUT 5 and then reading all bits of DUT 5 to determine if all are zeros. If any bits are ones at this time, the device has failed even the simplest test pattern and is rejected.

If DUT 5 passes this simple test, the test program instructs CPU 2 to use other simple test patterns, such as writing ones into all bits of DUT 5, and then reading each bit to verify that each bit contains a one. Several other simple test patterns, such as the checkerboard of FIG. 2c or the inverse checkerboard of FIG. 2d, may be used at this stage of testing to further screen devices for gross functional defects using a variety of simple test patterns which require a minimum of test time.

Devices which fail any of the simple patterns are rejected. Devices which pass all simple patterns under these operating conditions are then tested further, using the same simple patterns while altering one or more of the basic operating parameters. These operating parameters include power supply levels, reference voltage levels, timing generator period (operating frequency) and the delay between inputs to DUT 5 and the strobe of its outputs.

For example, at this point of the test, the program may instruct CPU 2 to decrease the power supply voltage, while maintaining other operating parameters fixed. The simplest test patterns are then repeated, and failing bits of DUT 5 determined. If DUT 5 passes all simple patterns, the CPU is then instructed to further alter the power supply voltage. This incremental altering of operating parameters will continue as defined in the test program. The test program will be written to instruct CPU 2 to continue altering an operating parameter until a predetermined end point value beyond the range specified for normal operation of the device is reached, or until a predetermined number of bits have failed. At this point in the test, failed bit locations are stored in memory 1.

The program may be written such that at this point, CPU 2 is instructed to return the power supply voltage to the normal operating range, and repeat the simple test patterns while incrementing another parameter until additional bits fail. The program may also provide that several parameters will be incremented at once, thus providing a further reduction in test time.

Memory 1 now contains a set of addresses corresponding to the failed bits, which are the weakest bits of DUT 5, i.e. those most likely to fail, even under normal operating conditions. Memory 1 may also contain, as part of the test program, a table of bits which allows bits structurally or operationally adjacent to the weak bits to be determined.

CPU 2 is then instructed by the test program to return all operating parameters to levels within the range specified for proper operation of the device. At this point, only the set of weak bits (or the set of weak bits and those bits structurally and/or operationally adjacent the weak bits) are further tested using complex patterns. While the complex patterns require much more computer time than the simple patterns, the set of bits tested by the complex patterns is very small in comparison to the set of bits comprising the entire array of the memory device under test. Overall test time is thereby reduced, while still allowing memory devices to be thoroughly tested prior to actual use in an operating system.

What is claimed is:

1. A method for testing a semiconductor memory device, containing a plurality of memory cells, each cell being capable of storing one bit, said method including the use of a computer and a set of instructions to said computer, said method comprising the steps of:
    testing the semiconductor memory device with a first set of tests utilizing simple test patterns;
    determining if said device functions properly during said first set of tests;
    classifying said device as a failed device if said device does not function properly during said first set of tests;
    further testing said device if said device functions properly during said first set of tests, with a second set of tests which comprises testing said device with one or more simple test patterns while one or more device operating conditions are altered beyond the limits specified for proper functioning of the device until one or more cells in said device fail to function properly, said one or more cells in said device which fail to function properly being the one or more weakest cells of said device;
    storing the location or locations of said weakest cells in the memory of said computer;
    testing only said weakest cells using a third set of tests, wherein said third set of tests utilizes test patterns which are more complex than the test patterns utilized in said second set of tests and wherein the operating conditions of said device during said third set of tests are within those specified for proper operation of said device;
    determining if said weakest cells properly function during said third set of tests; and
    classifying said device if its functions properly during said first set of tests, as an acceptable or failed device based on the results of said third set of tests.

2. The method as in claim 1 where said weakest cells and cells located physically near the weakest cells in said device are tested in said third set of tests to determine if said memory device as a whole is functioning properly.

3. The method as in claim 1 where said weakest cells and other cells contained in said device which are operationally near said weakest cells are tested in said third set of tests to determine if said device as a whole is functioning properly.

4. The method as in claim 1 where said weakest cells and other cells contained in said device known to be inherently likely to fail due to design and fabrication limitations are tested in said third set of tests to determine if the memory device as a whole is functioning properly.

5. The method as in claim 1, 2, 3 or 4 wherein said operating condition of said second set of tests which is altered is the power supply voltage applied to said memory device.

6. Structure for testing a semiconductor memory device containing input and output terminals and a plurality of memory cells, each cell being capable of storing one bit, comprising:
    reference voltage supply means for supplying reference signals at voltage levels corresponding to either a logical one or a logical zero, as required;
    power supply means for supplying the power required to operate said semiconductor memory device;
    timing generator means for supplying timing and clock pulses to said semiconductor memory device;
    voltage comparator means for comparing the voltage levels of output signals from said semiconductor memory device to the voltage levels of said reference signals from said reference voltage supply means;
    means for connecting said reference voltage supply means, said device power supply means, said timing generator means and said voltage comparator means to the proper input and output terminals of said semiconductor memory device;
    a central processing unit means (CPU) for controlling said device power supply means, said reference voltage supply means, said timing generator means and said voltage comparator means;
    operator interface means to allow an operator to control said CPU; and
    computer memory means containing a set of CPU instructions and adequate storage space for a set of address locations corresponding to the cells of said device most like to fail.

7. Structure as in claim 6 wherein said CPU instructions provide a set of test steps including the steps of:
    (a) testing a semiconductor memory device with a first set of tests utilizing simple test patterns;
    (b) determining if said device functions properly during said first set of tests;
    (c) classifying said device as a failed device if said device did not function properly during said first set of tests;
    (d) further testing said device if said device functions properly during said first set of tests to a second set of tests which comprises testing said device with one or more simple test patterns while one or more device operating conditions are altered beyond the limits specified for proper functioning of the device until one or more cells fail to function properly, said one or more cells in said device which fail to function properly being the one or more weakest cells of the memory device;

(e) storing the location or locations of said weakest cells in said computer memory;

(f) testing only said weakest cells using a third set of tests wherein said third set of tests utilizes test patterns which are more complex than the test patterns utilized in said second set of tests, and wherein the operating conditions of said device during those third set of tests are maintained within those specified for proper operation of said device;

(g) determining if said weakest cells properly function during said third set of tests; and (h) classifying said device as an acceptable or failed device based on the results of said third set of tests.

* * * * *